United States Patent
Liu et al.

(10) Patent No.: US 6,472,715 B1
(45) Date of Patent: Oct. 29, 2002

(54) REDUCED SOFT ERROR RATE (SER) CONSTRUCTION FOR INTEGRATED CIRCUIT STRUCTURES

(75) Inventors: Yauh-Ching Liu, Sunnyvale, CA (US); Helmut Puchner, Santa Clara, CA (US); Ruggero Castagnetti, San Jose, CA (US); Weiran Kong, Sunnyvale, CA (US); Lee Phan, Fremont, CA (US); Franklin Duan, Sunnyvale, CA (US); Steven Michael Peterson, Eagan, MN (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/675,109

(22) Filed: Sep. 28, 2000

(51) Int. Cl.$^7$ .............................................. H01L 29/76
(52) U.S. Cl. ........................ 257/371; 257/376; 257/387
(58) Field of Search ................................ 257/371, 376, 257/387

(56) References Cited

U.S. PATENT DOCUMENTS

| | | | | |
|---|---|---|---|---|
| 4,864,382 A | * | 9/1989 | Aoki | 357/64 |
| 5,338,963 A | * | 8/1994 | Klaasen | 257/376 |
| 5,731,619 A | * | 3/1998 | Subbanna | 257/374 |
| 5,780,907 A | * | 7/1998 | Ema | 257/371 |
| 6,087,849 A | * | 7/2000 | Zhang | 326/34 |
| 6,169,318 B1 | * | 1/2001 | McGrath | 257/445 |
| 6,281,554 B1 | * | 8/2001 | Pan | 257/357 |
| 6,329,693 B1 | * | 12/2001 | Kumagai | 257/371 |

FOREIGN PATENT DOCUMENTS

| | | | | |
|---|---|---|---|---|
| JP | 63301559 A | * | 12/1988 | ........... H01L/27/10 |
| JP | 02000172231 A | * | 6/2000 | |

OTHER PUBLICATIONS

Matsuda, Y., et al., "MeV–Boron Implanted Buried Barrier for Soft Error Reduction in Megabit DRAM", *Extended Abstracts of the 19th Conference on Solid State Devices and Materials*, Tokyo, 1987, pp. 23–26.

Yamashita, Tomohiro, et al., "Substrate Engineering for Reduction of Alpha–particle–Induced Charge Collection Efficiency", *Jpn. J. Appl. Phys.*, vol. 35, 1996, pp. 869–873.

* cited by examiner

Primary Examiner—Olik Chaudhuri
Assistant Examiner—Nathan W. Ha
(74) Attorney, Agent, or Firm—John P. Taylor

(57) ABSTRACT

An integrated circuit structures such as an SRAM construction wherein the soft error rate is reduced comprises an integrated circuit structure formed in a semiconductor substrate, wherein at least one N channel transistor is built in a P well adjacent to one or more deep N wells connected to the high voltage supply and the deep N wells extend from the surface of the substrate down into the substrate to a depth at least equal to that depth at which alpha particle-generated electron-hole pairs can effectively cause a soft error in the SRAM cell. For a 0.25 μm SRAM design having one or more N wells of a conventional depth not exceeding about 0.5 μm, the depth at which alpha particle-generated electron-hole pairs can effectively cause a soft error in the SRAM cell is from 1 to 3 μm. The deep N well of the 0.25 μm SRAM design, therefore, extends down from the substrate surface a distance of at least about 1 μm, and preferably at least about 2 μm. In a preferred embodiment, the implantation of the substrate to form the deep N well of the improved SRAM of the invention is carried out in a manner which will cause straggle, i.e., cause the doped volume comprising the deep N well to broaden at its base. Such a broadened base deep N well will have enhanced opportunity to collect electrons generated by the alpha particle collision with the substrate. This deep N well with a broadened base can be formed either by increasing the implant energy or by tilting the substrate with respect to the axis of the implant beam while implanting the substrate to form the deep N well.

13 Claims, 3 Drawing Sheets

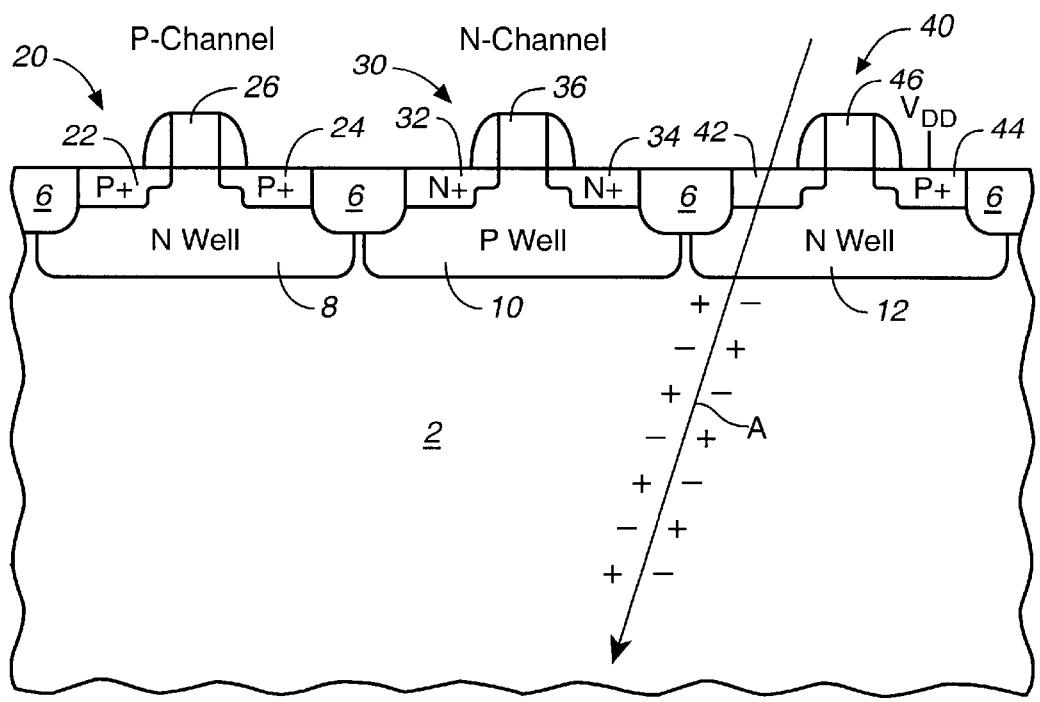
FIG._1 *(PRIOR ART)*
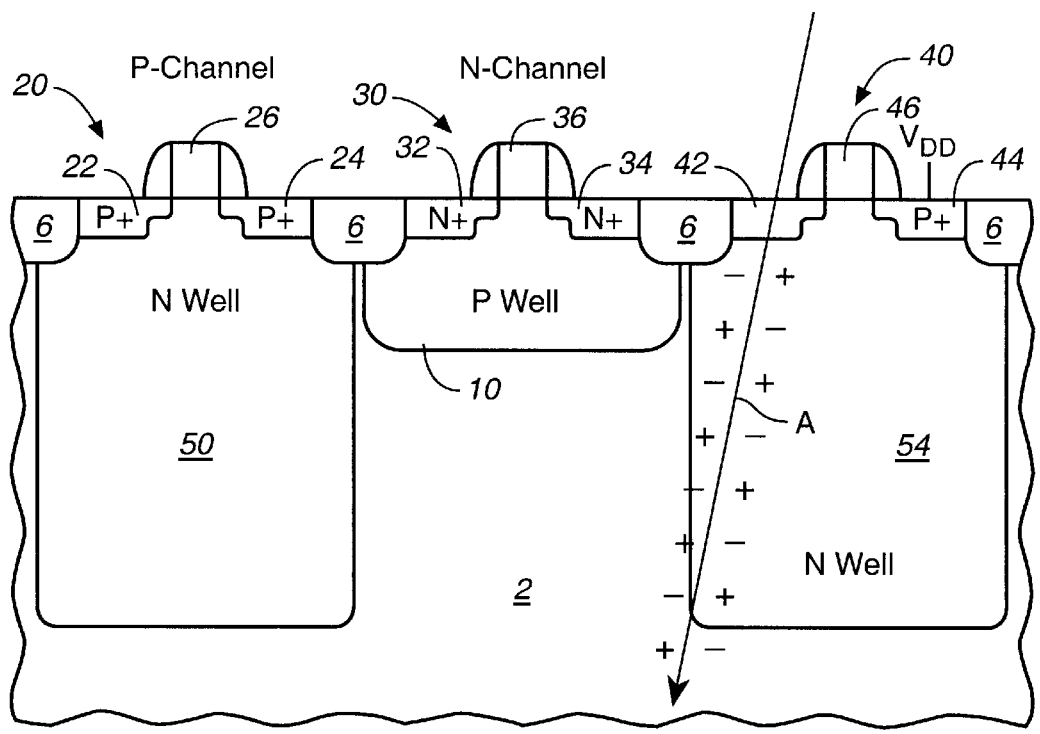
FIG._2

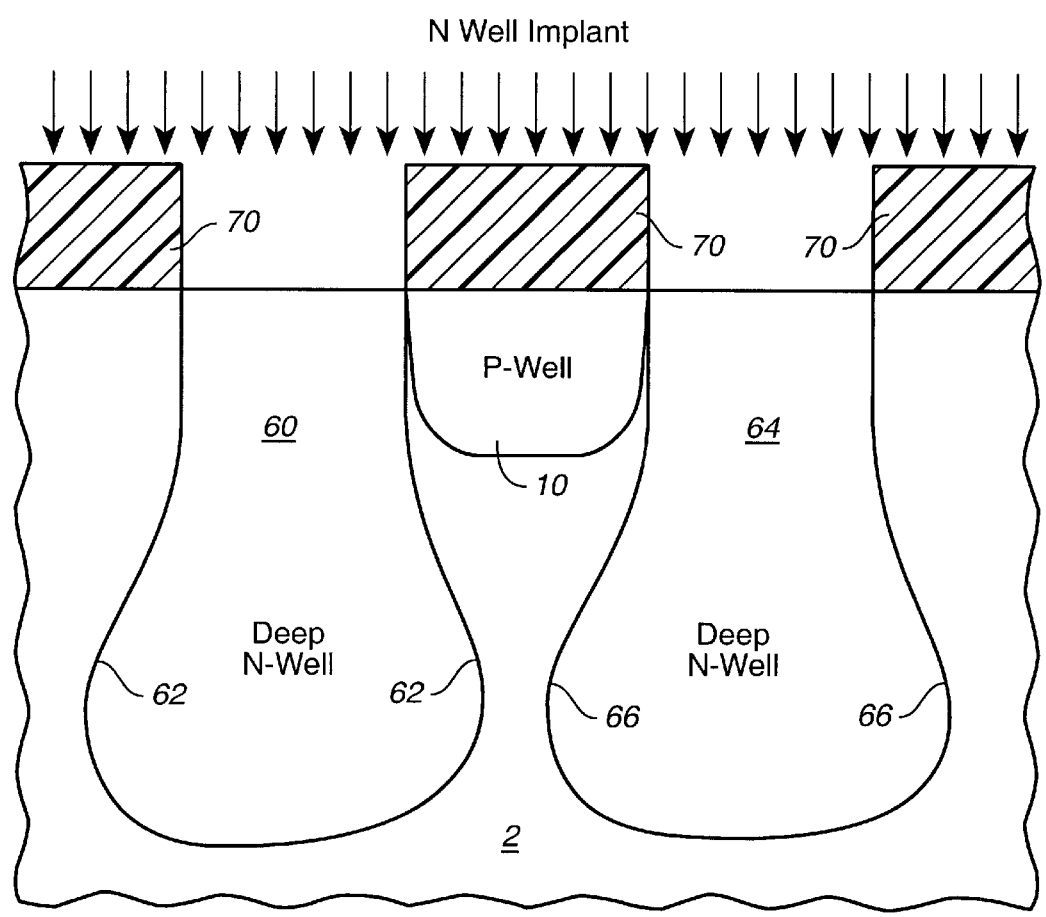
FIG._3

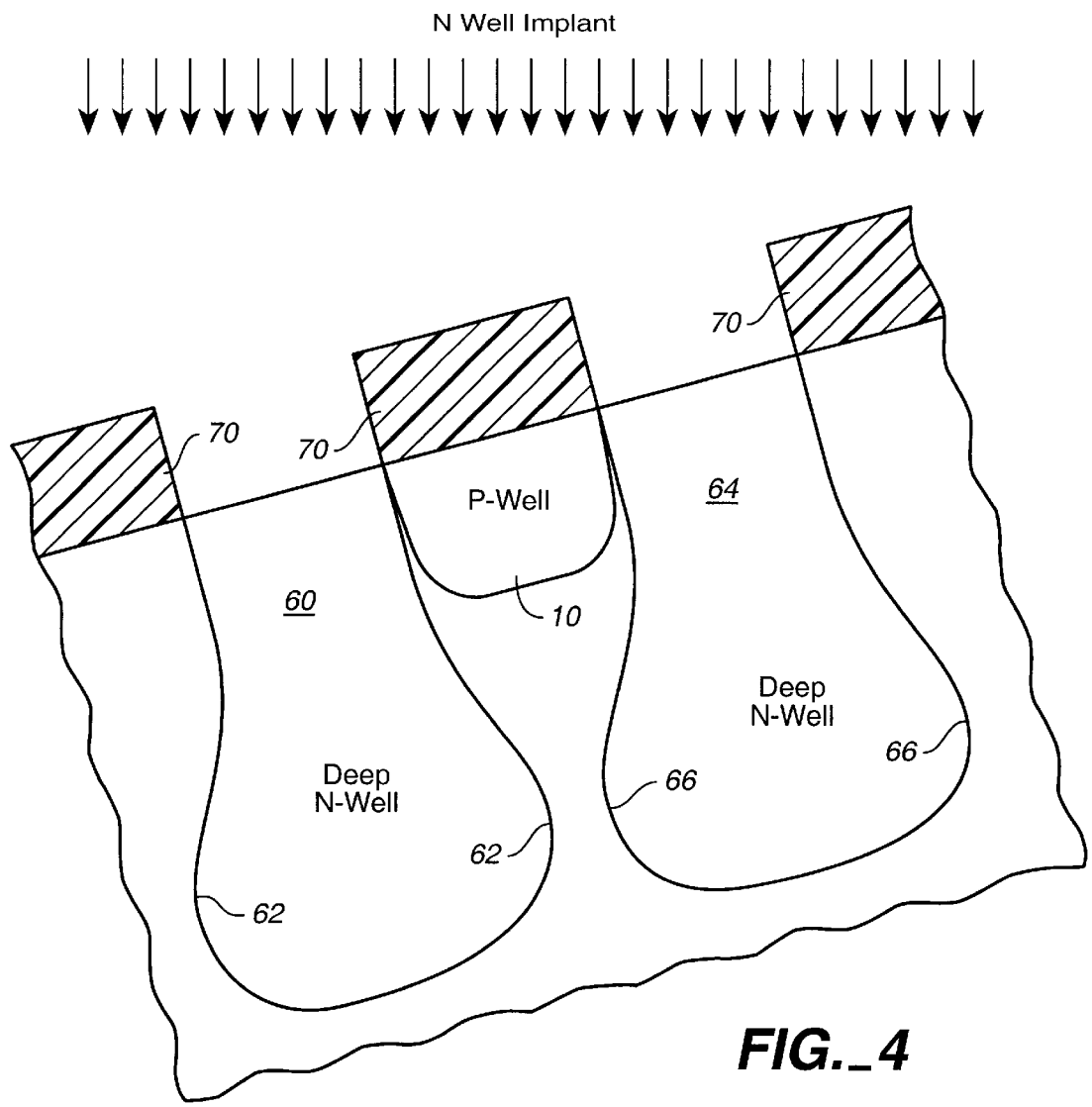
FIG._4

REDUCED SOFT ERROR RATE (SER) CONSTRUCTION FOR INTEGRATED CIRCUIT STRUCTURES

BACKGROUND OF THE INVENTION

1. Field of the Invention

This invention relates to integrated circuit structures. More particularly this invention relates to an integrated circuit structure having reduced soft error rate.

2. Description of the Related Art

As integrated circuit structures reduce down to sub 0.25 μm linewidths and the supply voltage (operating voltage) is reduced to less than ~2 volts, memory/logic devices are more prone to alpha particle-induced soft errors. The smaller the device size and the lower the supply voltage, the smaller the critical charge (Qcrit) will be for the device, where the critical charge (Qcrit) is the largest charge which can be injected into a memory array storage cell without changing the cell's logic state. Reduction of the soft error rate (SER) is, therefore, becoming more important as the memory device size shrinks and operating voltages are reduced.

The problem of alpha particle collisions is of particular concern with regard to N-channel transistors formed in P wells because of the higher mobility of electrons in silicon compared to holes, i.e, the electron in the electron-hole pair generated by the alpha particle collision is more likely to reach the N+ diffusion regions of the N channel transistor than is the corresponding hole to reach the P+ diffusion regions of a P channel transistor. Furthermore, in view of this greater sensitivity of N channel transistors to the problem of alpha particle collisions, the problem is further exacerbated for memory cells because of the preference for using N channel transistors in memory cells due to their faster speed. FIG. 1 shows a cross-section of a typical SRAM containing both N channel and P channel transistors. A first N well 8, a P well 10, and a second N well 12 are shown formed in a silicon semiconductor substrate 2. A first P channel transistor 20 formed in the surface of first N well 8 comprises P+ source/drain regions 22 and 24 separated by a gate electrode 26 formed over a channel region in first N well 8. Separated from P channel transistor 20 by field oxide portions 6 is an N channel transistor 30 formed in the surface of P well 10 comprising N+ source/drain regions 32 and 34 separated by a gate electrode 36 formed over a channel region in P well 10. A second P channel transistor 40 formed in the surface of second N well 12 and separated from N channel transistor 30 by field oxide 6 comprises P+ source/drain regions 42 and 44 separated by a gate electrode 46 formed over a channel region in second N well 12.

The path or trajectory of an alpha-particle is shown passing through transistor 40 and substrate 2 at A in FIG. 1, with electron-hole pairs shown generated by collisions between the alpha-particle and the silicon atoms of the substrate. If sufficient electrons generated by these collisions migrate to the N+ source/drain diffusion regions 32 and 34 of N channel transistor 30, the accumulated charge on the N+ regions 32 and 34 can cause an erroneous reading of the charge state (off/on state) of the SRAM cell, i.e., cause a soft error to occur.

In DRAM structures in the past, reduction in the soft error rate has been achieved in several ways. Y. Matsuda et al. et al., in "MeV-Boron Implanted Buried Barrier for Soft Error Reduction in Megabit DRAM", published in Extended Abstracts of the 19th Conference on Solid State Devices and Materials, Tokyo, (1987) at pages 23–26, describe the use of a buried layer of implanted boron in a P⁻ substrate to reduce the soft error rate in a DRAM cell.

More recently, T. Yamashita et al., in "Substrate Engineering for Reduction of Alpha-Particle-Induced Charge Collection Efficiency", published in the Japan Journal of Applied Physics, at Volume 35, Part 1, No. 2B (1996) at pages 869–873, identified three schemes for reducing charge collection efficiency (by the N+ diffusion regions of the DRAM memory cell). They state that charge collection efficiency (CCE) may be reduced by preventing minority carriers from traveling toward the diffusion layer; or by absorbing minority carriers by an extra fabricated layer; or by killing minority carriers before they reach the diffusion layer.

They then describe several structures which have been used for carrying out the above schemes to attain soft error reduction in DRAM memory cells, including a retrograde P well structure, a double well construction with an N well formed below the P well in a P⁻ substrate, a P well in a P⁻ epitaxial layer grown on a P+ substrate, and a buried defect layer formed below a P well. The buried defect layer is formed by high dosage implant of high energy silicon or boron ions into the substrate.

With respect to the double well construction, Yamashita et al. state that the CCE for the double well construction is much lower than that of the simple retrograde well. They then note that the alpha-particle-induced electrons coming from deep inside the substrate are not collected in the diffusion layer but accumulate in the bottom n-layer of the double well construction, indicating that the bottom n-layer is found to act as an effective shield for minority carriers, even in the case of high-level injection such as the incidence of alpha-particles. They then further observe that the CCE for the double well construction of 2 μm depth is lower than that of the double well of 3 μm depth, and state that it is, therefore, considered to be more effective to put this absorptive bottom n-layer near the surface for reduction in soft error rate.

With respect to the buried defect layer, Yamashita et al. after stating that the CCE for the P well with a buried layer is much lower than that for a simple P well, observe that the lattice defects induced by the implantation are considered to play an important role since silicon implantation, which does not give rise to a potential difference in the substrate, as well as boron implantation, both reduce CCE. They then indicate that these defects are considered to act as minority carrier killers.

Yamashita et al. then conclude that CCE for the double well is low because the bottom n-layer acts as an effective absorber for minority carriers, and that the CCE for a P well with a heavily doped buried layer fabricated by high-energy and high-dosage ion implantation is as low as that for a double well because the carrier lifetime is short in the buried layer due to lattice defects, and that it is more effective to fabricate the bottom n-layer or the buried layer near the surface to reduce CCE.

While the foregoing structures solved or at least mitigated the problem of alpha-particle-induced soft errors in DRAMS, similar soft error rate (SER) problems induced by alpha-particle radiation were not noted in at least some of the SRAM structures until recently in connection with the scaling down to the sub-0.25 μm regime. In view of such prior art teachings concerning the use of a buried defect layer to solve SER problems in DRAMs, this buried layer approach was experimented with in SRAM structures. Quite surprisingly, the addition of a buried defect layer beneath the P well of an SRAM structure was found to have little if any benefit in reducing SER.

Upon further consideration and comparison of the conventional prior art DRAM construction, it was concluded that the reason why the addition of a buried layer to the prior art SRAM structure did not reduce the soft error rate (unlike the prior art DRAM) may be due to the presence of both N wells and P wells in a prior art SRAM structure as shown in FIG. 1, compared to the single well of a prior art DRAM, which is usually a P well so that a faster N channel transistor may be constructed therein.

It was concluded that the presence of N wells in the prior art SRAM might be already providing the same amount of SER reduction in an SRAM as does the buried layer in a DRAM, thus rendering the addition of a buried layer in an SRAM construction superfluous. It was further concluded that the soft errors now being noted in the SRAM construction were not previously noted in larger scale devices because the larger problem of deep electron penetration was being addressed by either the buried layer of the DRAM cell or the N well regions of the SRAM construction, and because the lower Qcrit charge in smaller scale devices now made the present problem more noticeable.

The problem of reduction of the SER in integrated circuit structures such as, for example, sub 0.25 $\mu$m SRAM structures beyond the previously achieved reductions thus remained to be solved in a different manner.

SUMMARY OF THE INVENTION

The invention comprises an improved integrated circuit structure, such as a SRAM construction, wherein the soft error rate is reduced. The improved SRAM of the invention is formed in a semiconductor substrate, wherein at least one N channel transistor is built in a P well adjacent to at least one deep N well connected to the high voltage and the deep N well extends from the surface of the substrate down into the substrate to a depth at least equal to that depth at which alpha particle-generated electron-hole pairs can effectively cause a soft error in the SRAM cell. For a typical 0.25 $\mu$m SRAM design having one or more N wells of a conventional depth not exceeding about 0.5 $\mu$m, the depth at which alpha particle-generated electron-hole pairs can effectively cause a soft error in the SRAM cell is from 1 to 3 $\mu$m. In accordance with the invention, the deep N well of the invention, therefore, extends down from the substrate surface a distance of at least about 0.5 $\mu$m, and preferably at least about 2 $\mu$m. In a preferred embodiment, the implantation of the substrate to form the deep N well of the invention is carried out in a manner which will cause lateral straggle, i.e., cause the doped volume comprising the deep N well to broaden at its base. Such a broadened base deep N well will have enhanced opportunity to collect electrons generated by the alpha particle collisions with the substrate. This deep N well with a broadened base can be formed either by increasing the implant energy or by tilting the substrate with respect to the axis of the implant beam while implanting the substrate to form the deep N well.

BRIEF DESCRIPTION OF THE DRAWINGS

FIG. 1 is a fragmentary vertical cross-sectional view of a prior art SRAM structure showing the formation of an N channel transistor with N+ source/drain regions formed in a shallow P well adjacent shallow N wells containing P channel MOS transistors in a semiconductor substrate, with an alpha-particle shown impacting the substrate, leaving a trail of free electron-hole pairs generated along the path of the alpha-particle, whereby the electrons from such free electron-hole pairs can migrate through the substrate to the N+ regions of the N channel transistor in the shallow P well.

FIG. 2 is a fragmentary vertical cross-sectional view of the FIG. 1 prior art SRAM structure modified in accordance with the invention to provide deep N wells which generate an electric field to attract the free electrons generated in the substrate beneath the P well and between the deep N wells along the path of the alpha-particle.

FIG. 3 is a fragmentary vertical cross-sectional view of a modification of the deep N wells of FIG. 2, wherein the lower regions of the deep N wells are formed wider than the top portions of the N wells to enhance the collection of free electrons by the deep N wells.

FIG. 4 is a fragmentary vertical cross-sectional view illustrating an alternate way of forming the structure of FIG. 3, with the substrate tilted with respect to the axis of the implant beam during the implantation, so that the lower regions of the deep N wells will be formed wider than the top portions of the N wells to enhance the collection of free electrons by the deep N wells.

DETAILED DESCRIPTION OF THE INVENTION

The invention comprises an improved integrated circuit structure such as an SRAM having a reduced soft error rate formed in a semiconductor substrate, wherein at least one N channel transistor is built in a P well adjacent to at least one deep N well connected to the high voltage supply and the deep N well extends from the surface of the substrate down into the substrate to a depth at least equal to that depth at which alpha particle-generated electron-hole pairs can effectively cause a soft error in the SRAM cell. For a 0.25 $\mu$m SRAM design having one or more N wells of a conventional depth not exceeding about 0.5 $\mu$m, the depth at which alpha particle-generated electron-hole pairs can effectively cause a soft error in the SRAM cell is from 0.5 to 3 $\mu$m. In accordance with the invention, the deep N well of the 0.25 $\mu$m SRAM design, therefore, extends down from the substrate surface a distance of at least about 1 $\mu$m, and preferably at least about 2 $\mu$m. In a preferred embodiment, the implantation of the substrate to form the deep N well of the improved SRAM of the invention is carried out in a manner which will cause lateral straggle, i.e., cause the doped volume comprising the N well to broaden at its base. Such a broadened base deep N well will have enhanced opportunity to collect electrons generated by the alpha particle collision with the substrate. This deep N well with a broadened base can be formed either by increasing the implant energy or by tilting the substrate with respect to the axis of the implant beam while implanting the substrate to form the deep N well.

The depth of the P wells and N wells referred to herein, including the "deep N wells" of the invention, is defined as the distance between the surface of the substrate to the peak (Rp) of the dopant used to form the well.

The term "deep N well" as used herein, is intended to define an N well having a depth at least equal to the horizontal spacing from the deep N well to the next N well. Typically, in the prior art, the depth of the N well is only about 0.4 times the horizontal spacing between N wells.

While the structure of the inventions to reduce soft error rate will be described and illustrated herein with respect to an SRAM memory cell by way of illustration and not of limitation, the provision of a deep N well to reduce soft error rate may be applicable to a logic cell as well.

Turning to FIG. 2, wherein the same numerals are used to describe the same features previously described with respect to FIG. 1, the shallow N wells 8 and 12 of the prior art SRAM structure of FIG. 1 have been replaced by deep N wells 50 and 54 having a depth at least equal to or larger than the horizontal spacing between deep N wells 50 and 54.

Preferably the depth of deep N wells 50 and 54 will range from as least about twice the horizontal spacing between deep N wells 50 and 54 up to four or more times the horizontal spacing between deep N wells 50 and 54. Thus, for example, when the width between deep N wells 50 and 54 is about 1 μm, the depth of deep N wells 50 and 54 will be at least about 1 μm, and preferably will range from at least about 2 μm up to 4 μm or more in depth from the surface of substrate 2.

Deep N wells 50 and 54 may be formed by implanting silicon substrate 2 with an N type dopant such as phosphorus or arsenic. When phosphorus dopant is used the dopant may be implanted using a single energy level ranging from about 100 KeV up to about 300 KeV, as well as multiple implants ranging from 100 to 1000 KeV, depending upon the desired depth of the deep N wells. It should be pointed out that the thickness of the resist mask used to protect other portions of the substrate from the implant beam will have to be increased accordingly when higher implant energies are used to form the desired deep N wells (see thick resist mask 70 shown in FIGS. 3–4).

In accordance with the invention, when an alpha-particle impacts substrate 2, leaving a path or trajectory at A with electron-hole pairs shown generated by collisions between the alpha-particle and the silicon atoms, the electrons in such electron-hole pairs will be influenced by the space charge region between the deep N wells of the invention and the substrate, and the electric field will drift the electrons toward the deep N wells until they are collected by the deep N wells. Since the majority of such electrons will be collected by the deep N wells, the possibility of electrons diffusing upward to the surface and into the N+ diffusion regions is greatly reduced, resulting in a corresponding reduction in the soft error rate, and immunity to alpha-particle impaction is therefore improved.

Turning now to FIG. 3, a preferred embodiment of the invention is illustrated comprising a deep N well 60 having an enlarged lower portion or straggle shown at 62, and a deep N well 64 having an enlarged lower portion or straggle shown at 66. Such enlarged lower portions or straggle will inherently occur to some extent as a function of the depth of the implant. That is, the deeper the implant, the more likely that the dopant pattern implanted into the substrate will tend to enlarge or result in a "straggle" of dopant atoms, due to scattering of the implanted dopant atoms and/or impact of the silicon atoms of the substrate by the implanted dopant atoms.

It will be noted however, that the enlarged lower portions 62 and 66 of N wells 60 and 64 are still spaced from one another, i.e., the two N wells do not touch or overlap. This is very important for proper operation of the SRAM. When the N wells do not touch or overlap, i.e., are spaced from one another, and a potential is applied between the N well (e.g., at $V_{DD}$ potential) and the substrate (e.g., at $V_{SS}$ potential), a depletion region will form at the N-P junction between the deep N well and the P-type substrate. Forming this depletion region during operation of the SRAM cell is important to proper function of the cell. Thus, the distance which must be maintained between such enlarged portions of the respective deep N wells (separated from one another adjacent the surface of the substrate by the shallow P well) may be defined as that difference which will still permit formation of an N-P depletion region between the deep N well and the P type substrate when a potential is applied between the deep N well and the substrate.

While this straggle or widening of the width of the deep N well will naturally occur as a function of increased implant depth, it is desirable that at the implant depths of the deep N wells, the respective deep N wells extend as close as possible to one another without jeopardizing the formation of the above discussed depletion regions. At the preselected desired depth of the deep N wells, the naturally occurring straggle of the dopant may not result in the desired amount of lateral extension of the deep N wells toward each other. As shown in FIG. 4, the lateral extension of the deep N wells toward one another may be further increased by tilting the substrate during the implant with respect to the axis of the implant beam which is normally perpendicular to the plane of the substrate. The maximum extent of the tilt will again be governed by the extent of the resulting lateral extension of the N wells toward one another, with the maximum tilt not exceeding that angle which will still allow individual deep N wells to be formed without touching one another as determined by the ability to still form the desired respective (and separated) depletion regions between the deep N wells and the P type substrate. When the deep N well extends along one axis, i.e., along the axis normal to the plane of the paper of FIG. 4, the substrate is first tilted one way, as shown in FIG. 4, and then rotated to tilt the substrate the same amount in the opposite direction, e.g., first tilted ~30° counterclockwise to the horizontal, as shown in FIG. 4, and then tilted ~30° clockwise to the horizontal prior to the implant.

In another embodiment, however, deep N wells 62 and 66 may be allowed to connect or overlap one another provided that P well 10 is connected to Vss (the lowest supplied voltage in the circuitry) by a surface contact in order to define the electrical potential on P well 10.

Thus, the invention provides an integrated circuit structure such as an SRAM structure wherein deep N wells which extend down from the substrate surface to a depth at least equal to the horizontal spacing between the deep N wells provide the structure with enhanced protection against the occurrence of soft errors resulting from penetration of the structure by alpha-particles. Electrons in the substrate resulting from the electron-hole pairs generated by such alpha-particle penetration are attracted to the deep N wells by the electric field set up between the deep N wells and the substrate, and thus do not reach the N+ regions of the N channel transistor constructed in the P well, thus inhibiting the occurrence of soft errors such as, for example, in reading the on-off state of an SRAM cell.

Having thus described the invention what is claimed is:

1. An improved SRAM construction in a P-type semiconductor substrate, wherein at least one N channel transistor is built in a P well between at least two deep N wells and said deep N wells extend from a surface of the substrate down into the substrate to a depth at least twice the horizontal spacing between said deep N wells, whereby said depth of said deep N wells is at least equal to that depth at which electrons from alpha particle-generated electron-hole pairs can effectively cause a soft error in the SRAM construction, so that said deep N wells inhibit occurrence of said soft errors.

2. The SRAM cell of claim 1 wherein said P well has a depth not exceeding about 0.5 μm and said at least two deep N wells each has a depth of at least about 2 μm.

3. An improved SRAM construction in a P-type semiconductor substrate, wherein at least one N channel transistor is built in a P well positioned between and adjacent to two deep N wells, wherein said deep N wells each extend from the surface of the substrate down into said P-type substrate beyond the depth of said P well to a depth, from the surface of said substrate, at least equal to twice the horizontal spacing between said deep N wells, and said deep N wells extend laterally toward one another at their respective bases an amount insufficient to impede the formation of a depletion region between said deep N wells and that portion of said P-type substrate between said deep N wells below said P well when a potential is applied between said deep N wells and said P-type substrate, to thereby enhance collection of electrons from alpha particle-generated electron-hole pairs to thereby inhibit occurrence of soft errors in said SRAM cell.

4. An improved SRAM construction in a P-type semiconductor substrate, wherein at least one N channel transistor is built in a P well between at least two deep N wells and said deep N wells extend from a surface of the substrate down into the substrate to a depth at least twice the horizontal spacing between said deep N wells, whereby said depth of said deep N wells is at least equal to that depth at which electrons from alpha particle-generated electron-hole pairs can effectively cause a soft error in the SRAM construction, so that said deep N wells inhibit occurrence of said soft errors, and said respective depths of said at least two deep N wells are sufficient to cause each of said N wells to extend laterally at its base to enhance the opportunity of said deep N wells to collect electrons generated by said alpha particle-generated electron-hole pairs.

5. The SRAM cell of claim 4 wherein said deep N wells extend laterally toward one another at their respective bases to enhance the opportunity of said deep N wells to collect electrons generated by said alpha particle-generated electron-hole pairs.

6. The SRAM of claim 5 wherein the lateral extent of said deep N wells toward one another is insufficient to impede the formation of a depletion region between said deep N wells and that portion of said substrate between Said deep N wells below said shallow P well when a potential is applied between said deep N wells and said substrate.

7. The SRAM cell of claim 4 wherein said deep N wells are each formed with a portion of each deep N well extending, in the region of the substrate beneath said P well, toward the other deep N well, said portion of each deep N well extending toward said other deep N well having a shape formed by tilting the substrate during the implantation of said deep N wells.

8. The SRAM of claim 4 wherein the lateral extent of each of said deep N wells is sufficient to contact another deep N well in said substrate, and said P well between said deep N wells is provided with an electrical connection to a potential.

9. An improved SRAM construction in a P-type semiconductor substrate, wherein at least one N channel transistor is built in a P well adjacent to at least one deep N well formed on two opposite sides of said P well, wherein said deep N wells extend from the surface of the substrate down into the substrate beyond the depth of said shallow P well to a depth of at least 1 $\mu$m and wherein said deep N wells each has a depth from the surface of said substrate at least equal to the horizontal spacing between said deep N wells in said substrate, and further wherein the depth of said deep N wells is sufficient to cause each of said N wells to extend laterally at its base to enhance the pick up, by said deep N wells, of electrons generated by said alpha particle-generated electron-hole pairs, to thereby collect electrons from alpha particle-generated electron-hole pairs to thereby inhibit occurrence of soft errors in said SRAM cell.

10. The SRAM of claim 9 wherein the lateral extent of each of said deep N wells is insufficient to impede the formation of a depletion region between said deep N wells and said P-type substrate in the substrate region below said shallow P well when a potential is applied between said deep N wells and said substrate.

11. The SRAM cell of claim 9 wherein said deep N wells extend laterally toward one another at their respective bases to enhance the collection, by said deep N wells, of electrons generated by said alpha particle-generated electron-hole pairs.

12. The SRAM of claim 11 wherein the lateral extent of said deep N wells toward one another is insufficient to impede the formation of a depletion region between said deep N wells and that portion of said substrate between said deep N wells below said P well when a potential is applied between said deep N wells and said P-type substrate.

13. An improved SRAM construction in a P-type semiconductor substrate, wherein at least one N channel transistor is built in a P well adjacent to at least one deep N well formed on two opposite sides of said P well, wherein said deep N well extends from the surface of the substrate down into the substrate beyond the depth of said shallow P well to a depth of at least 1 $\mu$m to thereby collect electrons from alpha particle-generated electron-hole pairs to thereby inhibit occurrence of soft errors in said SRAM cell, and further wherein said deep N wells are each formed with a portion of each deep N well extending, in the region of the substrate beneath said P well, toward the other of said deep N wells, said portion of each deep N well extending toward said other deep N well having a shape formed by tilting the substrate during the implantation of said deep N wells.

* * * * *